(12) United States Patent
Karabed et al.

(10) Patent No.: US 9,003,263 B2
(45) Date of Patent: Apr. 7, 2015

(54) ENCODER AND DECODER GENERATION BY STATE-SPLITTING OF DIRECTED GRAPH

(71) Applicant: LSI Corporation, San Jose, CA (US)

(72) Inventors: Razmik Karabed, San Jose, CA (US); Shaohua Yang, San Jose, CA (US); Wu Chang, Sunnyvale, CA (US); Victor Krachkovsky, Allentown, PA (US)

(73) Assignee: LSI Corporation, San Jose, CA (US)

( * ) Notice: Subject to any disclaimer, the term of this patent is extended or adjusted under 35 U.S.C. 154(b) by 74 days.

(21) Appl. No.: 13/742,340

(22) Filed: Jan. 15, 2013

(65) Prior Publication Data

US 2014/0201585 A1 Jul. 17, 2014

(51) Int. Cl.
*G11C 29/00* (2006.01)
*G06F 11/14* (2006.01)
*G11C 11/56* (2006.01)
*G11C 11/26* (2006.01)

(52) U.S. Cl.
CPC ............ *G06F 11/14* (2013.01); *G11C 11/5642* (2013.01); *G11C 11/26* (2013.01); *G11C 11/5628* (2013.01)

(58) Field of Classification Search
CPC ................................ G06F 11/14; H03M 7/30
USPC ......... 714/746, 773, 704; 365/185.03, 185.09
See application file for complete search history.

(56) References Cited

U.S. PATENT DOCUMENTS

| | | |
|---|---|---|
| 5,278,703 A | 1/1994 | Rub et al. |
| 5,278,846 A | 1/1994 | Okayama |
| 5,317,472 A | 5/1994 | Schweitzer, III |
| 5,325,402 A | 6/1994 | Ushirokawa |
| 5,392,299 A | 2/1995 | Rhines |
| 5,417,500 A | 5/1995 | Martinie |
| 5,513,192 A | 4/1996 | Janku |
| 5,523,903 A | 6/1996 | Hetzler |
| 5,550,810 A | 8/1996 | Monogioudis et al. |
| 5,550,870 A | 8/1996 | Blaker |
| 5,612,964 A | 3/1997 | Haraszti |
| 5,710,784 A | 1/1998 | Kindred |
| 5,717,706 A | 2/1998 | Ikeda |
| 5,802,118 A | 9/1998 | Bliss |
| 5,844,945 A | 12/1998 | Nam |
| 5,898,710 A | 4/1999 | Amrany |
| 5,923,713 A | 7/1999 | Hatakeyama |
| 5,978,414 A | 11/1999 | Nara |
| 5,983,383 A | 11/1999 | Wolf |
| 6,005,897 A | 12/1999 | Mccalissister |
| 6,023,783 A | 2/2000 | Divsalar |
| 6,029,264 A | 2/2000 | Kobayashi |
| 6,065,149 A | 5/2000 | Yamanaka |

(Continued)

OTHER PUBLICATIONS

U.S. Appl. No. 13/227,416, Unpublished (filed Sep. 7, 2011) (Lei Chen).

(Continued)

*Primary Examiner* — Esaw Abraham
(74) *Attorney, Agent, or Firm* — Hamilton DeSanctis & Cha

(57) ABSTRACT

A method of generating a hardware encoder includes generating a first directed graph characterizing a constraint set for a constrained system, identifying a scaling factor for an approximate eigenvector for the first directed graph, applying the scaling factor to the approximate eigenvector for the first directed graph to yield a scaled approximate eigenvector, partitioning arcs between each pair of states in the first directed graph, performing a state splitting operation on the first directed graph according to the partitioning of the arcs to yield a second directed graph, and generating the hardware encoder based on the second directed graph.

20 Claims, 4 Drawing Sheets

(56) References Cited

U.S. PATENT DOCUMENTS

| | | | |
|---|---|---|---|
| 6,097,764 | A | 8/2000 | McCallister |
| 6,145,110 | A | 11/2000 | Khayrallah |
| 6,216,249 | B1 | 4/2001 | Bliss |
| 6,216,251 | B1 | 4/2001 | McGinn |
| 6,241,778 | B1 * | 6/2001 | de Lind van Wijngaarden et al. ............ 341/58 |
| 6,266,795 | B1 | 7/2001 | Wei |
| 6,317,472 | B1 | 11/2001 | Choi |
| 6,351,832 | B1 | 2/2002 | Wei |
| 6,377,610 | B1 | 4/2002 | Hagenauer |
| 6,381,726 | B1 | 4/2002 | Weng |
| 6,473,878 | B1 | 10/2002 | Wei |
| 6,535,553 | B1 | 3/2003 | Limberg et al. |
| 6,625,775 | B1 | 9/2003 | Kim |
| 6,748,034 | B2 | 6/2004 | Hattori |
| 6,757,862 | B1 | 6/2004 | Marianetti, II |
| 6,785,863 | B2 | 8/2004 | Blankenship |
| 6,810,502 | B2 | 10/2004 | Eidson |
| 6,970,511 | B1 | 11/2005 | Barnette |
| 6,986,098 | B2 | 1/2006 | Poeppelman |
| 7,047,474 | B2 | 5/2006 | Rhee |
| 7,058,873 | B2 | 6/2006 | Song |
| 7,073,118 | B2 | 7/2006 | Greenberg |
| 7,093,179 | B2 | 8/2006 | Shea |
| 7,117,427 | B2 | 10/2006 | Ophir |
| 7,133,228 | B2 | 11/2006 | Fung |
| 7,184,486 | B1 | 2/2007 | Wu |
| 7,191,378 | B2 | 3/2007 | Eroz |
| 7,203,887 | B2 | 4/2007 | Eroz |
| 7,308,061 | B1 | 12/2007 | Huang |
| 7,310,768 | B2 | 12/2007 | Eidson |
| 7,313,750 | B1 | 12/2007 | Feng |
| 7,370,258 | B2 | 5/2008 | Iancu |
| 7,383,180 | B2 * | 6/2008 | Thumpudi et al. ............ 704/229 |
| 7,415,651 | B2 | 8/2008 | Argon |
| 7,502,189 | B2 | 3/2009 | Sawaguchi |
| 7,523,375 | B2 | 4/2009 | Spencer |
| 7,587,657 | B2 | 9/2009 | Haratsch |
| 7,590,168 | B2 | 9/2009 | Raghavan |
| 7,646,829 | B2 | 1/2010 | Ashley |
| 7,702,986 | B2 | 4/2010 | Bjerke |
| 7,714,748 | B1 * | 5/2010 | Chaichanavong ............ 341/58 |
| 7,752,523 | B1 | 7/2010 | Chaichanavong |
| 7,779,325 | B2 | 8/2010 | Song |
| 7,802,172 | B2 | 9/2010 | Vila Casado et al. |
| 7,952,824 | B2 | 5/2011 | Dziak |
| 7,958,425 | B2 | 6/2011 | Chugg |
| 7,996,746 | B2 | 8/2011 | Livshitz |
| 8,018,360 | B2 | 9/2011 | Nayak |
| 8,049,648 | B2 * | 11/2011 | Chaichanavong ............ 341/58 |
| 8,201,051 | B2 | 6/2012 | Tan |
| 8,237,597 | B2 | 8/2012 | Liu |
| 8,261,171 | B2 | 9/2012 | Annampedu |
| 8,291,284 | B2 | 10/2012 | Savin |
| 8,295,001 | B2 | 10/2012 | Liu |
| 2008/0069373 | A1 | 3/2008 | Jiang |
| 2008/0304558 | A1 | 12/2008 | Zhu et al. |
| 2009/0132893 | A1 | 5/2009 | Miyazaki |
| 2009/0185643 | A1 | 7/2009 | Fitzpatrick |
| 2011/0167227 | A1 | 7/2011 | Yang |
| 2011/0264987 | A1 | 10/2011 | Li |
| 2012/0124118 | A1 | 5/2012 | Ivkovic |
| 2012/0182643 | A1 | 7/2012 | Zhang |
| 2012/0207201 | A1 | 8/2012 | Xia |
| 2012/0212849 | A1 | 8/2012 | Xu |
| 2012/0262814 | A1 | 10/2012 | Li |
| 2012/0265488 | A1 | 10/2012 | Sun |

OTHER PUBLICATIONS

U.S. Appl. No. 13/186,234, Unpublished (filed Jul. 19, 2011) (Haitao Xia).

U.S. Appl. No. 13/283,549, Unpublished (filed Oct. 27, 2011) (Wu Chang).

U.S. Appl. No. 13/296,022, Unpublished (filed Nov. 14, 2011) (Victor Krachkovsky).

U.S. Appl. No. 13/174,537, Unpublished (filed Jun. 30, 2011) (Anantha Raman Krishnan).

U.S. Appl. No. 13/180,495, Unpublished (filed Jul. 11, 2011) (Chung-Li Wang).

U.S. Appl. No. 13/171,615, Unpublished (filed Jun. 29, 2011) (Bradley D. Seago).

U.S. Appl. No. 13/269,832, Unpublished (filed Oct. 10, 2011) (Haitao Xia).

U.S. Appl. No. 13/239,683, Unpublished (filed Sep. 22, 2011) (Changyou Xu).

U.S. Appl. No. 13/174,453, Unpublished (filed Jun. 30, 2011) (Johnson Yen).

U.S. Appl. No. 13/445,834, Unpublished (filed Apr. 12, 2012) (Chung-Li Wang).

U.S. Appl. No. 13/433,693, Unpublished (filed Mar. 29, 2012) (Fan Zhang).

U.S. Appl. No. 13/597,026, Unpublished (filed Aug. 28, 2012) (Fan Zhang).

U.S. Appl. No. 13/284,767, Unpublished (filed Oct. 28, 2011) (Fan Zhang).

U.S. Appl. No. 13/741,003, Unpublished (filed Jan. 14, 2013) (Lu Lu).

U.S. Appl. No. 13/213,751, Unpublished (filed Aug. 19, 2011) (Fan Zhang).

U.S. Appl. No. 13/670,393, Unpublished (filed Nov. 6, 2012) (Lei Chen).

U.S. Appl. No. 13/622,294, Unpublished (filed Sep. 18, 2012) (Fan Zhang).

U.S. Appl. No. 13/474,660, Unpublished (filed May 17, 2012) (Zongwang Li).

U.S. Appl. No. 13/363,751, Unpublished (filed Feb. 1, 2012) (Lei Chen).

U.S. Appl. No. 13/422,986, Unpublished (filed Mar. 16, 2012) (Fan Zhang).

U.S. Appl. No. 13/545,833, Unpublished (filed Jul. 10, 2012) (Zhi Bin Li).

U.S. Appl. No. 13/596,819, Unpublished (filed Aug. 28, 2012) (Shaohua Yang).

U.S. Appl. No. 13/596,947, Unpublished (filed Aug. 28, 2012) (Fan Zhang).

U.S. Appl. No. 13/596,978, Unpublished (filed Aug. 28, 2012) (Fan Zhang).

U.S. Appl. No. 13/597,001, Unpublished (filed Aug. 28, 2012) (Fan Zhang).

U.S. Appl. No. 13/619,907, Unpublished (filed Sep. 14, 2012) (Fan Zhang).

U.S. Appl. No. 13/621,341, Unpublished (filed Sep. 17, 2012) (Shaohua Yang).

U.S. Appl. No. 13/989,583, Unpublished (filed Oct. 15, 2012) (Shaohua Yang).

U.S. Appl. No. 13/340,974, Unpublished (filed Dec. 30, 2011) (Dan Liu).

U.S. Appl. No. 13/300,078, Unpublished (filed Nov. 18, 2011) (Chung-Li Wang).

U.S. Appl. No. 13/295,150, Unpublished (filed Nov. 14, 2011) (Zongwang Li).

U.S. Appl. No. 13/305,510, Unpublished (filed Nov. 28, 2011) (Lei Chen).

U.S. Appl. No. 13/369,468, Unpublished (filed Feb. 9, 2012) (Zongwang Li).

U.S. Appl. No. 13/340,951, Unpublished (filed Dec. 30, 2011) (Lei Chen).

U.S. Appl. No. 13/445,878, Unpublished (filed Apr. 12, 2012) (Yu Liao).

U.S. Appl. No. 13/305,551, Unpublished (filed Nov. 28, 2011) (Yang Han).

U.S. Appl. No. 13/302,119, Unpublished (filed Nov. 22, 2011) (Lei Chen).

U.S. Appl. No. 13/269,852, Unpublished (filed Oct. 10, 2011) (Haitao Xia).

(56) References Cited

OTHER PUBLICATIONS

U.S. Appl. No. 13/327,279, Unpublished (filed Dec. 15, 2011) (Wei Feng).
Adler et al., "Algorithms for Sliding Block Codes, An Application of Symbolic Dynamics to Information Theory", IEEE Transactions on Information Theory, vol. IT-29, No. 1 (1/83).
Axvig et al., "Average Min-Sum Decoding of LDPC Codes", 5th International Symposium on Turbo Codes and Related Topics (2008).
Karabed et al., "Sliding-Block Coding for Input-Restricted Channels", IEEE Transactions on Information Theory, vol. 34, No. 1 (Jan. 1988).
Lin et al "An efficient VLSI Architecture for non binary LDPC decoders"—IEEE Transaction on Circuits and Systems II vol. 57, Issue 1 (Jan. 2010) pp. 51-55.
Adler et al., "Algorithms for Sliding Block Codes, An Application of Symbolic Dynamics to Information Theory", IEEE Transactions on Information Theory, vol. IT-29, No. 1 (Janu.
Bahl et al., "Optimal decoding of linear codes for minimizing symbol error rate", IEEE Trans. Inform. Theory, vol. 20, pp. 284-287 (Mar. 1974).
Blaum, "High-Rate Modulation Codes for Reverse Concatenation", IEEE Transactions on Magnetics, vol. 43, No. 2 (Feb. 2007).
Casado et al., Multiple-rate low-density parity-check codes with constant blocklength, IEEE Transations on communications, Jan. 2009, vol. 57, pp. 75-83.
Cui et al., "High-Throughput Layered LDPC Decoding Architecture", IEEE Transactions on Very Large Scale Integration (VLSI) Systems, vol. 17, No. 4 (Apr. 2009).
Fair et al., "Guided scrambling: a new line coding technique for high bit rate fiber optic transmission systems", IEEE Trans. Commun., vol. 39, pp. 289-297 (Feb. 1991).
Fan et al., "Constrained coding techniques for soft iterative decoders" Proc. IEEE Global Telecommun. Conf., vol. 1b, pp. 631-637 (1999).
Fossorier, Marc P.C. "Quasi-Cyclic Low-Density Parity-Check Codes From Circulant Permutation Maricies" IEEE Transactions on Information Theory, vol. 50, No. 8 Aug. 8, 2004.
Gross, "Stochastic Decoding of LDPC Codes over Gf(q)", HDPCC Workshop, Tel Aviv (Mar. 2, 2010).
Gunnam et al., "VlSI Architectures for Layered Decoding for Irregular LDPC Codes of WiMax", IEEE ICC Proceedings (2007).
Hagenauer, J. et al A Viterbi Algorithm with Soft-Decision Outputs and its Applications in Proc. IEEE Globecom, pp. 47. 11-47 Dallas, TX Nov. 1989.
Han and Ryan, "Pinning Techniques for Low-Floor Detection/Decoding of LDPC-Coded Partial Response Channels", 5th International Symposium on Turbo Codes &Related Topics, 2008.
Jin et al., "Design Techniques for Weakly Constrained Codes", IEEE Trans Commun. vol. 51, No. 5, pp. 709-714 (May 2003).
Kautz, "Fibonacci Codes For Synchronization Control", IEEE Trans. Info. Theory, vol. 11, No. 2, pp. 284-292 (Apr. 1965).
Kschischang et al., "Factor Graphs and the Sum-Product Algorithm", IEEE Transactions On Information Theory, vol. 47, No. 2 (Feb. 2001).
Leduc-Primeau et al., "A Relaxed Half-Stochastic Iterative Decoder for LDPC Codes", IEEE Communications Society, IEEE Globecom proceedings (2009).
Lee et al., "Partial Zero-Forcing Adaptive MMSE Receiver for DS-CDMA Uplink in Multicell Environments" IEEE Transactions on Vehicular Tech. vol. 51, No. 5, Sep. 2002.
Li et al "Efficient Encoding of Quasi-Cyclic Low-Density Parity Check Codes" IEEE Transactions on Communications on 53 (11) 1973-1973, 2005.
Lim et al. "Convergence Analysis of Constrained Joint Adaptation in Recording Channels" IEEE Trans. on Signal Processing vol. 54, No. 1 Jan. 2006.
Moon et al, "Pattern-dependent noise prediction in signal-dependent Noise," IEEE JSAC, vol. 19, No. 4 pp. 730-743, Apr. 2001.
Moon et al., "Maximum transition run codes for data storage systems", IEEE Trans. Magn., vol. 32, No. 5, pp. 3992-3994 (Sep. 1996).
Shokrollahi "LDPC Codes: An Introduction", Digital Fountain, Inc. (Apr. 2, 2003).
Spagnol et al, "Hardware Implementation of GF($2^m$) LDPC Decoders", IEEE Transactions on Circuits and Systemsši: Regular Papers, Vol. 56, No. 12 (Dec. 2009).
Tehrani et al., "Fully Parallel Stochastic LDPC Decoders", IEEE Transactions On Signal Processing, vol. 56, No. 11 (Nov. 2008).
Todd et al., "Enforcing maximum-transition-run code constraints and low-density parity check decoding", IEEE Trans. Magn., vol. 40, No. 6, pp. 3566-3571 (Nov. 2004).
U.S. Appl. No. 13/227,544, Unpublished (filed Sep. 8, 2011) (Shaohua Yang).
U.S. Appl. No. 13/113,219, Unpublished (filed May 23, 2011) (Yang Han).
U.S. Appl. No. 13/316,741, Unpublished (filed Dec. 12, 2011) (Yang Han).
U.S. Appl. No. 13/316,858, Unpublished (filed Dec. 12, 2011) (Zongwang Li).
U.S. Appl. No. 13/362,409, Unpublished (filed Jan. 31, 2012) (Fan Zhang).
U.S. Appl. No. 13/445,848, Unpublished (filed Apr. 12, 2012) (Bruce Wilson).
U.S. Appl. No. 13/412,520, Unpublished (filed Mar. 5, 2012) (Fan Zhang).
U.S. Appl. No. 13/426,714, Unpublished (filed Mar. 22, 2012) (Shaohua Yang).
U.S. Appl. No. 13/284,730, Unpublished (filed Oct. 28, 2011) (Fan Zhang).
U.S. Appl. No. 13/372,580, Unpublished (filed Feb. 14, 2012) (Fan Zhang).
Vasic, B., "High-Rate Girth-Eight Codes on Rectangular Integer Lattices", IEEE Trans. Communications, vol. 52, Aug. 2004, pp. 1248-1252.
Vasic, B., "High-Rate Low-Density Parity-Check Codes Based on Anti-Pasch Affine Geometries," Proc ICC 2002, pp. 1332-1336.
Weon-Cheol Lee et al., "Vitierbi Decoding Method Using Channel State Info. in COFDM System" IEEE Trans. on Consumer Elect., IEEE Service Center, NY, NY vol. 45, No. 3 Aug. 1999.
Yeo et al., "VLSI Architecture for Iterative Decoders in Magnetic Storage Channels", Mar. 2001, pp. 748-755, IEEE trans. Magnetics, vol. 37, No. 2.
Zhang et al., "Analysis of Verification-Based Decoding on the q-ary Symmetric Channel for Large q", IEEE Trans. On Information Theory, vol. 57, No. 10 (Oct. 2011).
Zhong et al., "Design of VLSI Implementation-Oriented LDPC Codes", IEEE, pp. 670-673, 2003.
Zhong et al., "High-Rate Quasi-Cyclic LDPC Codes for Magnetic Recording Channel with Low Error Floor", ISCAS, IEEE pp. 3546-3549, May 2006.
Zhong et al., "Quasi Cyclic LDPC Codes for the Magnetic Recording Channel: Code Design and VSLI Implementation", IEEE Transactions on Magnetics, v. 43, pp. 1118-1123, Mar. 2007.
Zhong et al., "Joint Code-Encoder Design for LDPC Coding System VLSI Implementation", ISCAS, IEEE pp. 389-392, May 2004.
Zhong, "Block-LDPC: A Practical LDPC Coding System Design Approach", IEEE Trans. On Circuits, Regular Papers, vol. 5, No. 4, pp. 766-775, Apr. 2005.

* cited by examiner

ENCODER AND DECODER GENERATION BY STATE-SPLITTING OF DIRECTED GRAPH

FIELD OF THE INVENTION

Various embodiments of the present invention provide systems and methods for encoding and decoding data for constrained systems with state-split based endecs.

BACKGROUND

Various products including hard disk drives and transmission systems utilize a read channel device to encode data, store or transmit the encoded data on a medium, retrieve the encoded data from the medium and decode and convert the information to a digital data format. Such read channel devices may include data processing circuits including encoder and decoder circuits or endecs to encode and decode data as it is stored and retrieved from a medium or transmitted through a data channel, in order to reduce the likelihood of errors in the retrieved data. It is important that the read channel devices be able to rapidly and accurately decode the original stored data patterns in retrieved or received data samples.

The encoded data may be constrained to follow one or more rules that reduce the chance of errors. For example, when storing data on a hard disk drive, it may be beneficial to avoid long runs of consecutive transitions, or long runs of 0's or 1's. It can be difficult to design endecs to encode data according to such constraints that avoid complex circuitry.

BRIEF SUMMARY

Various embodiments of the present invention provide systems and methods for encoding and decoding data for constrained systems with state-split based encoders and decoders. In some embodiments, this includes generating a directed graph or digraph DG that characterizes the constraint set for a constrained system, having an approximate eigenvector AE. In order to reduce the hardware complexity of the resulting encoder and/or decoder, a state splitting operation is performed to reduce the digraph to a final digraph in which each state has only one branch. The encoder and/or decoder based on the final digraph has reduced hardware complexity, particularly in the memory structure used to track state changes across branches.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phrases do not necessarily refer to the same embodiment. This summary provides only a general outline of some embodiments of the invention. Additional embodiments are disclosed in the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals may be used throughout several drawings to refer to similar components. In the figures, like reference numerals are used throughout several figures to refer to similar components.

DETAILED DESCRIPTION OF THE INVENTION

Various embodiments of the present invention provide systems and methods for encoding and decoding data for constrained systems with state-split based endecs. The digraph for the endec is reduced by state splitting to a final digraph free of states with many branches, making it much easier to describe the system in hardware and reducing the complexity of the resulting encoder and/or decoder, particularly for soft constrained systems. In particular, the memory structure in the hardware can be greatly simplified if it does not need to store information about a large number of branches from states. In some embodiments, the final digraph includes only states having one branch.

Figure 1:
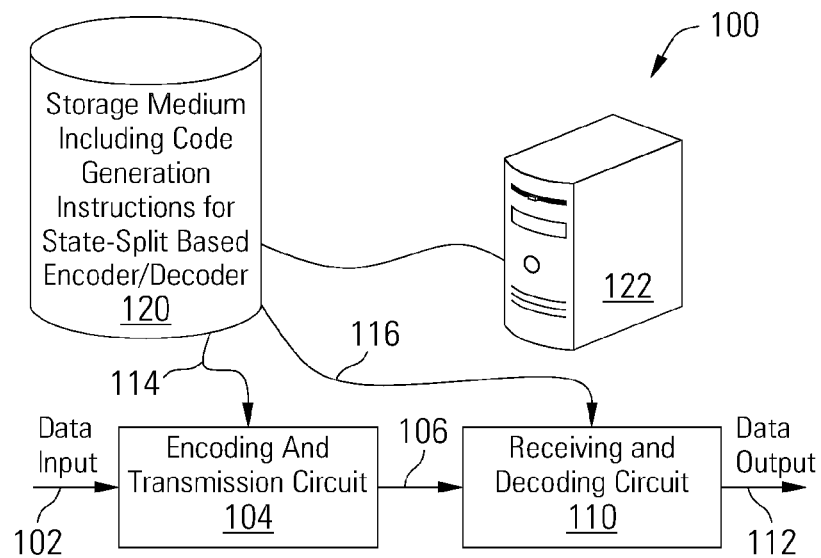
FIG. 1 depicts a data processing system with a state-split based encoding circuit and decoding circuit in accordance with various embodiments of the present inventions.

Turning to FIG. 1, a data processing system 100 is shown in accordance with various embodiments of the present invention. Data processing system 100 includes a processor 122 that is communicably coupled to a computer readable medium 120. As used herein, the phrase "computer readable" medium is used in its broadest sense to mean any medium or media capable of holding information in such a way that it is accessible by a computer processor. Thus, a computer readable medium may be, but is not limited to, a magnetic disk drive, an optical disk drive, a random access memory, a read only memory, an electrically erasable read only memory, a flash memory, or the like. Based upon the disclosure provided herein, one of ordinary skill in the art will recognize a variety of computer readable mediums and/or combinations thereof that may be used in relation to different embodiments of the present inventions. Computer readable medium 120 includes instructions executed by processor 122 to produce a state-split based encoder 114 and a corresponding decoder 116.

The state-split based encoder 114 and the corresponding decoder 116 are based on a final digraph having few branches per state, and in some embodiments, having only one branch per state. State-split based encoder 114 is provided to an encoding and transmission circuit 104, for example as an encoder design to be used in the design of the encoding and transmission circuit 104 or as an executable encoder. The encoding and transmission circuit 104 encodes a data input 102 using state-split based encoder 114 to produce a encoded data 106. The corresponding decoder 116 is provided to a receiving and decoding circuit 110 that decodes encoded data 106 using decoder 116 to provide a data output 112.

Figure 2:
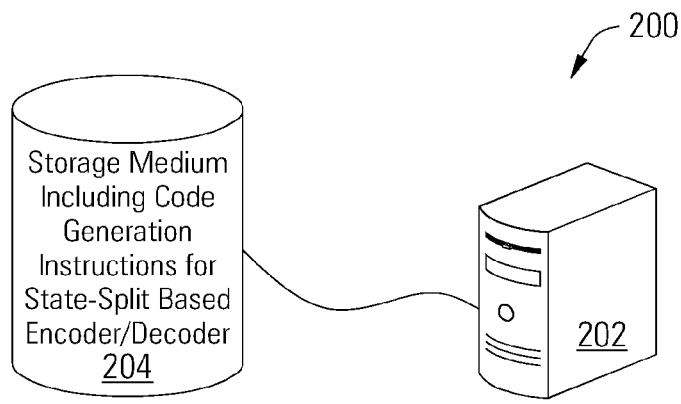
FIG. 2 depicts a code generation system for a state-split based encoder and/or decoder (endec) in accordance with some embodiments of the present inventions.

Turning to FIG. 2, a code generation system 200 is shown in accordance with some embodiments of the present invention. Code generation system 200 includes a computer 202 and a computer readable medium 204. Computer 202 may be any processor based device known in the art. Computer readable medium 204 may be any medium known in the art including, but not limited to, a random access memory, a hard disk drive, a tape drive, an optical storage device or any other device or combination of devices that is capable of storing data. Computer readable medium includes instructions executable by computer 202 to generate a state-split based constrained system encoder and decoder having a final digraph free of states with many branches. In some cases, the instructions may be software instructions. In other cases, the instructions may include a hardware design, or a combination of hardware design and software instructions. Based upon the disclosure provided herein, one of ordinary skill in the art will recognize other types of instructions that may be used in relation to different embodiments of the present inventions.

Figure 3:
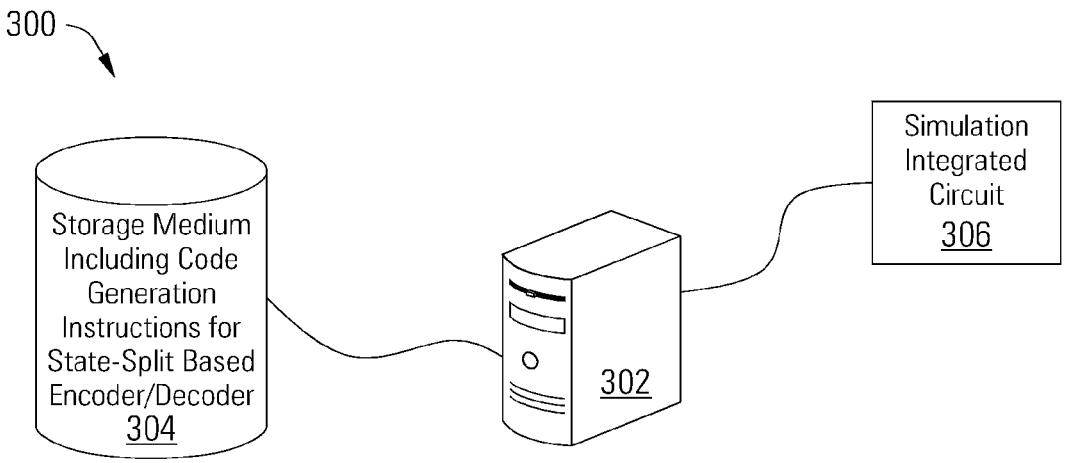
FIG. 3 depicts another code generation system for a state-split based endec in accordance with other embodiments of the present inventions.

Turning to FIG. 3, another code generation system 300 is shown in accordance with other embodiments of the present invention. Code generation system 300 includes a computer 302 and a computer readable medium 304. Computer 302 may be any processor based device known in the art. Computer readable medium 304 may be any medium known in the art including, but not limited to, a random access memory, a hard disk drive, a tape drive, an optical storage device or any other device or combination of devices that is capable of storing data. Computer readable medium includes instructions executable by computer 302 to generate a state-split based constrained system encoder and decoder having a final digraph free of states with many branches. In some cases, the instructions may be software instructions. In other cases, the instructions may include a hardware design, or a combination of hardware design and software instructions. Based upon the disclosure provided herein, one of ordinary skill in the art will recognize other types of instructions that may be used in relation to different embodiments of the present inventions.

In addition, code generation system 300 includes a simulation integrated circuit 306. Simulation integration circuit 306 may be used to implement and test the state-split based constrained system encoder and decoder, including encoding and decoding test data and providing data characterizing the performance of the encoder and decoder, such as incidence of error and latency information. Based upon the disclosure provided herein, one of ordinary skill in the art will appreciate a variety of distributions of work between computer 302 executing instructions and simulation integrated circuit 306.

Figure 4:
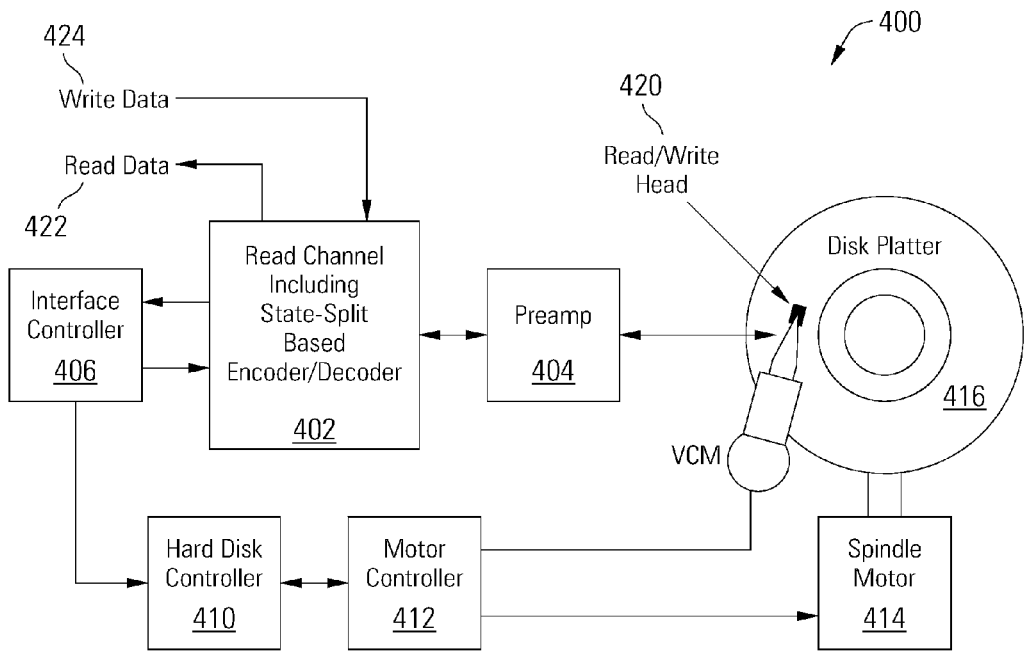
FIG. 4 depicts a storage system including a state-split based encoder/decoder in accordance with some embodiments of the present inventions.

Although an encoder and decoder generated as disclosed herein are not limited to use in any particular application, they may be used in a read channel of a storage device. Turning to FIG. 4, a storage system 400 including a read channel circuit 402 with a state-split based constrained system encoder and decoder having a final digraph free of states with many branches is shown in accordance with some embodiments of the present inventions. Storage system 400 may be, for example, a hard disk drive. Storage system 400 also includes a preamplifier 404, an interface controller 406, a hard disk controller 410, a motor controller 412, a spindle motor 414, a disk platter 416, and a read/write head 420. Interface controller 406 controls addressing and timing of data to/from disk platter 416. The data on disk platter 416 consists of groups of magnetic signals that may be detected by read/write head assembly 420 when the assembly is properly positioned over disk platter 416. In one embodiment, disk platter 416 includes magnetic signals recorded in accordance with either a longitudinal or a perpendicular recording scheme.

In a typical read operation, read/write head assembly 420 is accurately positioned by motor controller 412 over a desired data track on disk platter 416. Motor controller 412 both positions read/write head assembly 420 in relation to disk platter 416 and drives spindle motor 414 by moving read/write head assembly to the proper data track on disk platter 416 under the direction of hard disk controller 410. Spindle motor 414 spins disk platter 416 at a determined spin rate (RPMs). Once read/write head assembly 420 is positioned adjacent the proper data track, magnetic signals representing data on disk platter 416 are sensed by read/write head assembly 420 as disk platter 416 is rotated by spindle motor 414. The sensed magnetic signals are provided as a continuous, minute analog signal representative of the magnetic data on disk platter 416. This minute analog signal is transferred from read/write head assembly 420 to read channel circuit 402 via preamplifier 404. Preamplifier 404 is operable to amplify the minute analog signals accessed from disk platter 416. In turn, read channel circuit 402 decodes and digitizes the received analog signal to recreate the information originally written to disk platter 416. This data is provided as read data 422 to a receiving circuit. A write operation is substantially the opposite of the preceding read operation with write data 424 being provided to read channel circuit 402. This data is then encoded and written to disk platter 416. When writing and reading data, read channel circuit 402 encodes data to be written and decodes data as it is read using a state-split based encoder and corresponding decoder, which are based on a final digraph having few branches per state. It should be noted that various functions or blocks of storage system 400 may be implemented in either software or firmware, while other functions or blocks are implemented in hardware.

Storage system 400 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 400, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

Figure 5:
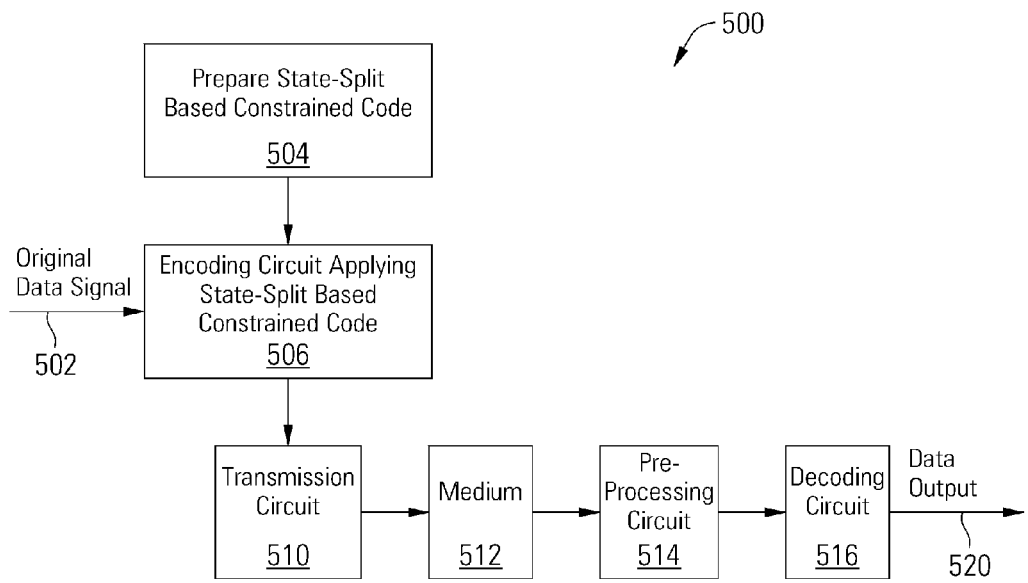
FIG. 5 depicts a data processing system including a state-split based encoder/decoder in accordance with various embodiments of the present inventions.

Turning to FIG. 5, a data processing system 500 relying on a state-split based encoder and corresponding decoder is shown in accordance with various embodiments of the present invention. Data processing system 500 includes a state-split based encoding circuit 506 that applies constraint encoding to an original input 502, where the final digraph for the encoder has few branches per state, and in some embodiments, only one branch per state. Original input 502 may be any set of input data. For example, where data processing system 500 is a hard disk drive, original input 502 may be a data set that is destined for storage on a storage medium. In such cases, a medium 512 of data processing system 500 is a storage medium. As another example, where data processing system 500 is a communication system, original input 502 may be a data set that is destined to be transferred to a receiver via a transfer medium. Such transfer mediums may be, but are not limited to, wired or wireless transfer mediums. In such cases, a medium 512 of data processing system 500 is a transfer medium. The design or instructions for the state-split based encoder and decoder are received from a block 504 that generates a state-split based encoder and decoder having a final digraph free of states with many branches as disclosed below based upon constraints to be applied in the system.

Encoding circuit 506 provides encoded data (i.e., original input encoded using the multiplication and division free encoder) to a transmission circuit 510. Transmission circuit 510 may be any circuit known in the art that is capable of transferring the received encoded data via medium 512. Thus, for example, where data processing circuit 500 is part of a hard disk drive, transmission circuit 510 may include a read/write head assembly that converts an electrical signal into a series of magnetic signals appropriate for writing to a storage medium. Alternatively, where data processing circuit 500 is part of a wireless communication system, transmission circuit 510 may include a wireless transmitter that converts an electrical signal into a radio frequency signal appropriate for transmission via a wireless transmission medium. Transmission circuit 510 provides a transmission output to medium 512.

Data processing circuit 500 includes a pre-processing circuit 514 that applies one or more analog functions to transmitted input from medium 512. Such analog functions may include, but are not limited to, amplification and filtering. Based upon the disclosure provided herein, one of ordinary skill in the art will recognize a variety of pre-processing circuitry that may be used in relation to different embodiments of the present invention. Pre-processing circuit 514 provides a pre-processed output to a decoding circuit 516. Decoding circuit 516 includes a decoder that is capable of reversing the encoding process applied by encoding circuit 506 to yield data output 520.

An encoder 506 and decoder 516 with relatively simple hardware is generated using digraphs which characterize the system constraints. The final digraph is free of states with many branches, and in some embodiments, has only one branch per state, greatly reducing the complexity of the resulting hardware. The constraints may, for example, prevent undesirable patterns for a particular storage or transmission medium, such as long runs of 0's or long runs of transitions.

Figure 6:
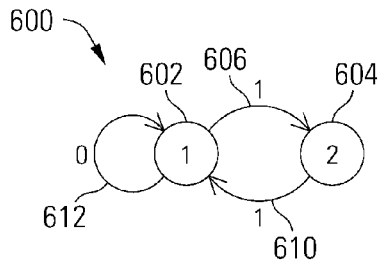
FIG. 6 depicts a digraph illustrating a constrained system in accordance with various embodiments of the present inventions.

Turning to FIG. 6, a simple labeled digraph (DG) 600 is shown having two states, state 1 602 and state 2 604, with paths or edges entering and exiting the states 602 and 604 that are labeled to indicate the output value when that path is taken. From state 1 602 a self-loop 612 is labeled 0 to indicate that a 0 is output when the system transitions from state 1 602 back to state 1 602 in one step. An arc 606 from state 1 602 to state 2 604 is labeled 1, indicating that a 1 is output when the system transitions from state 1 602 to state 2 604. Arc 610 from state 2 604 to state 1 602 is labeled 1. Given a labeled digraph 600, the output can be determined by taking the paths from state to state. For example, starting from state 1 602 and taking self-loop 612, arc 606, arc 610 and self-loop 612 yields an output of 0110. In this labeled digraph 600, 1's are produced in even numbers. When designing a code for a constrained system, a labeled digraph can be produced that characterizes the constraint set.

Constraint sequences can be mapped to sequences generated by a labeled digraph using symbolic dynamics. In this process, a connectivity matrix is generated for the labeled digraph. For the labeled digraph 600 of FIG. 6, the connectivity matrix is:

$$\begin{bmatrix} 1 & 1 \\ 1 & 0 \end{bmatrix}$$

where element 1,1 represents the connection 612 from state 1 602 to state 1 602, element 1,2 represents the connection 606 from state 1 602 to state 2 604, element 2,1 represents the connection 610 from state 2 604 to state 1 602, and the 0 in element 2,2 represents the lack of a connection from state 2 604 to state 2 604.

The highest rate code that can be designed from a labeled digraph can be computed as log($\lambda$), where $\lambda$ is the largest real and positive eigenvalue of connectivity matrix. For an eigenvalue $\lambda$, there is a vector x that satisfies the equation $A*x=\lambda*x$, where A is the connectivity matrix, x is a vector, and $\lambda$ is the eigenvalue number. If the matrix A is non-negative and real, meaning that there are no complex numbers in the connectivity matrix, and that it contains 0's or positive numbers, then $\lambda$ is also a real, positive number that allows the computation of the highest rate code. If the input block length of the encoder is denoted K, and the output block length is denoted N, where N>K, the encoder can be designed to map the K input bits to N output bits in an invertible manner. Given K input bits, there are $2^K$ input patterns to be mapped to outputs. Each of the N blocks are referred to as codewords in a codeword space, generally a subset of all the possible output patterns. The resulting encoder has a rate K/N, and the higher the rate, the greater the efficiency of the encoding.

Figure 7A:
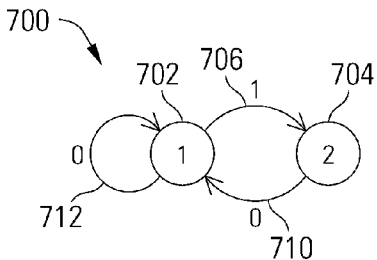
FIGS. 7a and 7b depicts a digraph and corresponding $2^{nd}$ power digraph illustrating another constrained system in accordance with various embodiments of the present inventions.
Figure 7B:
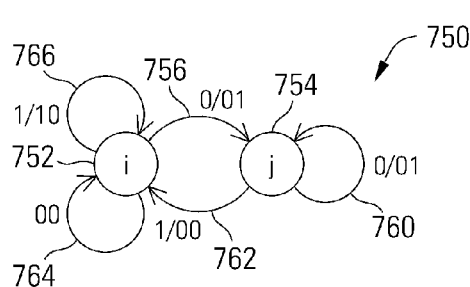

The labeled digraph characterizes the constraints and can be used to calculate the code rate, but does not define the mapping between inputs and outputs. The mapping can be performed using a power of a labeled digraph. Turning to FIGS. 7A and 7B, another labeled digraph 700 and its $2^{nd}$ power digraph 750 are shown to illustrate a possible mapping between input and output patterns. Labeled digraph 700 includes state 1 702 and state 2 704, with arc 706 from state 1 702 to state 2 704 labeled 1, arc 710 from state 2 704 to state 1 702 labeled 0, and self-loop 712 from state 1 702 labeled 0. This labeled digraph 700 will not generate two 1's in sequence. If 1's represent transitions, then no two transitions are adjacent.

To map input bits to output bits, a digraph may be taken to a power based on the rate and on the number of output bits for each input bit. For example, in a 1/2 rate code, two output bits are produced for every input bit, and the $2^{nd}$ power 750 of the digraph 700 may be used for the mapping. The $2^{nd}$ power digraph 750 of the digraph 700 has the same number of states, state i 752 and state j 754. There is an arc from state i 752 to state j 754 in the $2^{nd}$ power digraph 750 if there is a path of length two from state 1 702 to state 2 704 in digraph 700. Because state 1 702 to state 2 704 in digraph 700 can be reached in two steps on arcs 712 and 706, with labels 0 and 1, $2^{nd}$ power digraph 750 includes an arc 756 labeled 01 from state i 752 to state j 754. Based on the two-step paths in digraph 700, $2^{nd}$ power digraph 750 also includes self-loop 760 labeled 01 from state j 754, arc 762 labeled 00 from state j 754 to state i 752, self-loop 764 labeled 00 from state i 752 and self-loop 766 labeled 10 from state i 752. These labels represent the outputs for each state transition from state i 752 and state j 754.

Input bits can be mapped to the paths in $2^{nd}$ power digraph 750 in any suitable manner, including in a somewhat arbitrary manner. Based upon the disclosure provided herein, one of ordinary skill in the art will recognize a variety of mapping techniques that may be used to characterize a constrained code from a digraph. Each incoming bit is assigned to a path in $2^{nd}$ power digraph 750, for example assigning incoming bit 1 when received in state i 752 to self-loop 766, so that when a 1 is received in that state, a 10 is yielded at the output. (The notation 1/10 is used in the label for self-loop 766, with the incoming value before the slash and the outgoing value after the slash.) Incoming bit 0 is assigned when received in state i 752 to arc 756 so that when a 1 is received in state i 752, a 01 is output. At this point, with incoming bit values 0 and 1 having been mapped for state i 752, self-loop 764 is not needed. Incoming bit values 0 and 1 when received in state j 754 are assigned to self-loop 760 and arc 762, respectively.

The $2^{nd}$ power digraph 750 when labeled defines the encoder, because it describes fully how input bits are mapped to output bits at a rate 1:2, or code rate 1/2, in an invertible manner that satisfies the constraint of preventing consecutive 1's.

In this simple example, each state 752 and 754 had sufficient outgoing edges to map each possible input bit. However, given a digraph and its powers, this is often not the case. For example, to design a 2/3 code rate encoder based on labeled digraph 700, the labeled digraph 700 is taken to the $3^{rd}$ power, yielding connectivity matrix $$\begin{bmatrix} 2 & 1 \\ 1 & 1 \end{bmatrix}$$

for the $2^{nd}$ power and connectivity matrix $$\begin{bmatrix} 3 & 2 \\ 2 & 1 \end{bmatrix}$$

for the 3rd power. This indicates that state 1 in the $3^{rd}$ power digraph will have 5 outgoing edges and state 2 in the $3^{rd}$ power digraph will have 3 outgoing edges. Given two input bits in the 2/3 code rate encoder, four outgoing edges are needed from each state, and state 2 has too few outgoing edges, preventing the simple mapping of input to output bits in a power of the original digraph as in FIGS. 7A and 7B.

State splitting may be used to manipulate the digraph to produce another digraph that generates the same sequences, but for which every state has at least the necessary number of outgoing edges so that the encoder can be designed by arbitrarily assigning input bits to outgoing edges. State splitting redistributes outgoing edges, taking them from states with an excess and redistributing them to states with insufficient edges until each state has at least the minimum number of outgoing edges to achieve the desired code rate. In general, because λ can be any real number, the x vector may also be a non-integral real number. Given a log(λ) that is at least slightly larger than the desired code rate, a non-negative integer approximate eigenvector can be found that satisfies the equation $A*x \geq \lambda*x$, where x is a non-negative integer that enables the use of a state splitting algorithm.

In general, state splitting is performed by identifying the largest coordinates of vector x and splitting the corresponding state into a number of smaller states. The outgoing edges from the original state are partitioned into two or more subsets, each of which are assigned to a new state. Each of the new smaller states have the same input as the original state. The resulting digraph thus has more states than the original digraph, with a new approximate eigenvector. In some embodiments, the end result of the state splitting operation is an approximate eigenvector in which every state has a coordinate or weight of 1 or 0, with the number of states equaling the sum of the coordinates of vector x.

State splitting can also be performed to reduce the number of branches in the states in the final digraph. In general, state-split based coding methods start from an initial labeled digraph DGs with an approximate integer eigenvector AEs, and produce a final labeled digraph DGf with an approximate eigenvector AEf of all ones and zeros, or with coordinates of all ones and zeros. The approximate eigenvector AEf of final labeled digraph DGf together with a 1:1 map $E:\{0,1\}^m \to S$ define the code which the encoder and decoder apply. Set S comprises all finite sequences obtained from reading the labels of paths in labeled digraph DGf. In practice, there are many parameters contributing to the hardware complexity of the encoder and decoder for the resulting code, including the number of states in AEf, the memory/anticipation in labeled digraph DGf, the rate of the code, the block length of the code, and the number of branches of the states in DGf. In general, states with many branches contribute more to hardware complexity than states with fewer branches. The state-split based coding method is therefore designed to produce a final digraph DGf having states with a small number of branches, and in some embodiments, to have only states with one branch. In other state splitting coding methods, AEs is chosen to be as small as possible. However, in the state splitting used to generate the state-split based endec disclosed herein, AEs is scaled to go from DGs to DGf in one round of state splitting, and to produce a final digraph DGf with only one branch per state, thereby easing the hardware complexity associated with state branching.

A labeled digraph DG=(V, A, L) consists of a finite set of states $V=V_{DG}$, a finite set of arcs $A=A_{DG}$ where each arc e has an initial state $\sigma_{DG}(e) \in V_{DG}$ and a terminal state $\tau_{DG}(e) \in V_{DG}$, and an arc labeling $L=L_{DG}:A \to H$ where H is a finite alphabet. A set of all finite sequences obtained from reading the labels of paths in a labeled digraph DG is called a constrained system, S. DG presents S, denoted by S=S (DG).

Given a digraph DG, a non-negative integer vector AE is an approximate integer eigenvector if:

$$T(DG)*AE(DG) \geq P + 2^m*AE(DG) \qquad \text{(Eq 1)}$$

where T(DG) is the connectivity matrix for DG, label alphabet set H is $\{0,1\}^n$ for some positive integer n, P is a vector of real numbers, $P \geq 0$, m is a positive integer, and $m/n \leq \lambda$, where λ is the largest eigenvalue of T.

More specifically, given a digraph DGs with its approximate eigenvector AEs, $$Ts(DGs)*AEs(DGs) > Ps + 2^m*AEs(DGs) \qquad \text{(Eq 2)}$$

where Ts(DG) is the transition matrix for DGs and $Ps \geq 0$ is a vector of real numbers.

To split a state i into two states, state i1 and state i2, a weight is assigned to each arc e outgoing from state i, where the weight of arc e is equal to AEs, the coefficient of the starting approximate eigenvector AEs for the terminating state of arc e. The outgoing edges from state i are partitioned into two sets, one with total weight $w*2^m$ and one with total weight $(AEs(\text{state } i)-w)*2^m$, for some positive integer w. State i is then split into two states, state i1 and state i2. The set of arcs with weight $w*2^m$ are given to state i1 and the set of arcs with weight $(AEs(\text{state } i)-w)*2^m$ are given to state i2. Incoming arcs of state i are duplicated for state i1 and state i2. If outgoing arcs from state i cannot be partitioned in this manner, state i is not split. A state-splitting step does not change the constraint system, so S(DGs)=S(DGs after splitting of state i). Only the representing digraph has changed.

Traditional state-split based coding methods suggest a sequence of state splitting that results in a digraph DGf having an approximate eigenvector AEf with all ones and zeros coordinates according to Equation 3:

$$Tf(DGf)*AEf(DGf) \geq Pf+2^m*AEf(DGf) \quad \text{(Eq 3)}$$

A map $F: V_{DGf}(\text{state set of DGf}) \to V_{DGs}(\text{state set of DGs})$ can be defined such that F(state t)=state j if state t can be traced back to state i through the steps of state splitting in the natural sense. Also, the number of branches of a state t, in DGf, is L if F(follower set(state t)) has cardinality L.

Having a non-uniform number of branches or having states with a large number of branches in DGf burdens the hardware with extra complexity, large look-up tables or big logic blocks. In some embodiments, to ensure that each state has only one branch and thereby reduce the hardware complexity associated with branches, two steps are taken. One, the approximate eigenvector AEs of the starting digraph DGs is scaled by an integer scaling factor $\alpha$. The new approximate eigenvector is denoted by $AEs\alpha$. The inequality of Equation 3 becomes the inequality of Equation 4:

$$Ts(DGs)*AEs\alpha(DGs) \geq Ps\alpha+2^m*AEs\alpha(DGs) \quad \text{(Eq 4)}$$

where $AEs\alpha(DGs)=AEs(DGs)*\alpha$ and $Ps\alpha=Ps*\alpha$. Two, let $V_{DGs}=\{\text{state } 1, \text{state } 2, \ldots, \text{state } q\}$, then for every pair of integers i and j, $1 \leq i, j \leq q$, arcs from state i to state j are partitioned into sets of cardinality t according to Equation 5:

$$t = \left\lceil \frac{2^m}{AEs\alpha(\text{state } j)} \right\rceil \quad \text{(Eq 5)}$$

such that cardinality t is the smallest integer not smaller than the quantity $2^m$ divided by the scaled eigenvector coordinate for state j, or the result of the ceiling function on the quantity $2^m$ divided by the scaled eigenvector coordinate for state j. For example, $\lceil 3.99 \rceil=4$, $\lceil 4 \rceil=4$, and $\lceil 3.001 \rceil=4$.

If n(i, j) represents the number of arcs from state i to state j, the number of sets in the partitioning of the arcs going from state i to state j is N(i, j):

$$N(i, j) = \left\lceil \frac{n(i, j)}{t} \right\rceil \quad \text{(Eq 6)}$$

The partitioning may be denoted as $A(i, j)=\{A_1(i, j), A_2(i, j), \ldots, A_{N(i,j)}(i, j)\}$. Each state, state i, is split according to the follower state, state j, and the portioning of the arcs from state i to state j. The resulting digraph is called DGf. The DGf states are indexed in a natural way, with the state having arcs in $A_k(i, j)$ being indexed (i, j, k).

Because outgoing arcs of the new state (i, j, k) lead to states that come from splitting state j, stages in DGf have single branches. In order to accomplish the second of the two steps disclosed above, the following inequality should be satisfied for every i:

$$\sum_{\text{all } j} N(i, j) * \left\lceil \frac{2^m}{AEs\alpha(j)} \right\rceil * AEs\alpha(j) \geq 2^m * AEs\alpha(i) \quad \text{(Eq 7)}$$

If $\alpha$ from the first of the two steps disclosed above is large enough, the inequality in Equation 7 will hold. The proof is as follows. From Equations 5 and 6 it can be written that:

$$n(i, j) = N(i, j) * \left\lceil \frac{2^m}{AEs\alpha(\text{state } j)} \right\rceil + \Delta(i, j) \quad \text{(Eq 8)}$$

where $\Delta(i, j)$ is an integer, and $$0 \leq \Delta(i, j) < \left\lceil \frac{2^m}{AEs\alpha(\text{state } j)} \right\rceil \quad \text{(Eq 9)}$$

It is claimed that:

$$\Delta(i, j) * \frac{AEs\alpha(\text{state } j)}{2^m} < 1 \quad \text{(Eq 10)}$$

If $$\frac{2^m}{AEs\alpha(\text{state } j)}$$

is an integer, then the claim is true based on the second inequality in Equation 9. If $$\frac{2^m}{AEs\alpha(\text{state } j)}$$

is not an integer, then $$\Delta(i, j) * \frac{AEs\alpha(\text{state } j)}{2^m} \geq 1 \quad \text{(Eq 11)}$$

implies that $$\Delta(i, j) \geq \frac{2^m}{AEs\alpha(\text{state } j)} \quad \text{(Eq 12)}$$

Because $\Delta(i, j)$ is an integer and the right side of Equation 12 is not integer, Equation 13 would have to be true:

$$\Delta(i, j) \geq \left\lceil \frac{2^m}{AEs\alpha(\text{state } j)} \right\rceil \quad \text{(Eq 13)}$$

But the inequality of Equation 13 contradicts Equation 9. Therefore the claim is again shown to be true.

Equation 4 can be rewritten:

$$\frac{Ts(DGs) * AEs\alpha(DGs)}{2^m} > \frac{Ps\alpha}{2^m} + 2^m * AEs\alpha(DGs), \quad \text{(Eq 14)}$$

For state i, $$\sum_{all\ j} \frac{n(i,j) * AEs\alpha(j)}{2^m} \geq \frac{PS\alpha(i)}{2^m} + AES\alpha(i) \quad \text{(Eq 15)}$$

Using Equation 8, $$\sum_{all\ j} \frac{\left(N(i,j) * \left\lceil \frac{2^m}{AEs\alpha(j)} \right\rceil + \Delta(i,j)\right) * AEs\alpha(j)}{2^m} \geq \quad \text{(Eq 16)}$$

$$\frac{PS\alpha(i)}{2^m} + AES\alpha(i)$$

$$\sum_{all\ j} N(i,j) * \left\lceil \frac{2^m}{AEs\alpha(j)} \right\rceil * \frac{AEs\alpha(j)}{2^m} + \sum_{all\ j} \Delta(i,j) * \frac{AEs\alpha(j)}{2^m} \geq$$

$$\frac{PS\alpha(i)}{2^m} + AES\alpha(i)$$

By the claim made above, the second summation of Equation 16 is upper bounded by the number of j's, the number of follower states of state i. Therefore, if α is selected to be large enough, then for every i:

$$\sum_{all\ j} \Delta(i,j) * \frac{AEs\alpha(j)}{2^m} \leq \frac{PS\alpha(i)}{2^m} \quad \text{(Eq 17)}$$

The assumption can be made that Ps(i)>0, if the left side of Equation 17 is non-zero. Further:

$$\sum_{all\ j} N(i,j) * \left\lceil \frac{2^m}{AEs\alpha(j)} \right\rceil * \frac{AEs\alpha(j)}{2^m} \geq \quad \text{(Eq 18)}$$

$$\left( \frac{PS\alpha(i)}{2^m} - \sum_{all\ j} \Delta(i,j) * \frac{AEs\alpha(j)}{2^m} \right) + AES\alpha(i)$$

V is defined as in Equation 19:

$$v(i) = \left( \frac{PS\alpha(i)}{2^m} - \sum_{all\ j} \Delta(i,j) * \frac{AEs\alpha(j)}{2^m} \right) \quad \text{(Eq 19)}$$

From Equation 17, v(i)>0. Replacing the second term on the right side of Equation 18 by v(i), v(i)>0:

$$\sum_{all\ j} N(i,j) * \left\lceil \frac{2^m}{AEs\alpha(j)} \right\rceil * \frac{AEs\alpha(j)}{2^m} \geq v(i) + AES\alpha(i) \quad \text{(Eq 20)}$$

The inequality in Equation 20 holds for every i, therefore Equation 7 immediately follows. Again, Equation 7 is the inequality that should be satisfied in order to accomplish the second of the two steps disclosed above that cause the state-splitting to produce a final digraph DGf with states having only one branch, thereby reducing the hardware complexity.

Figure 8:
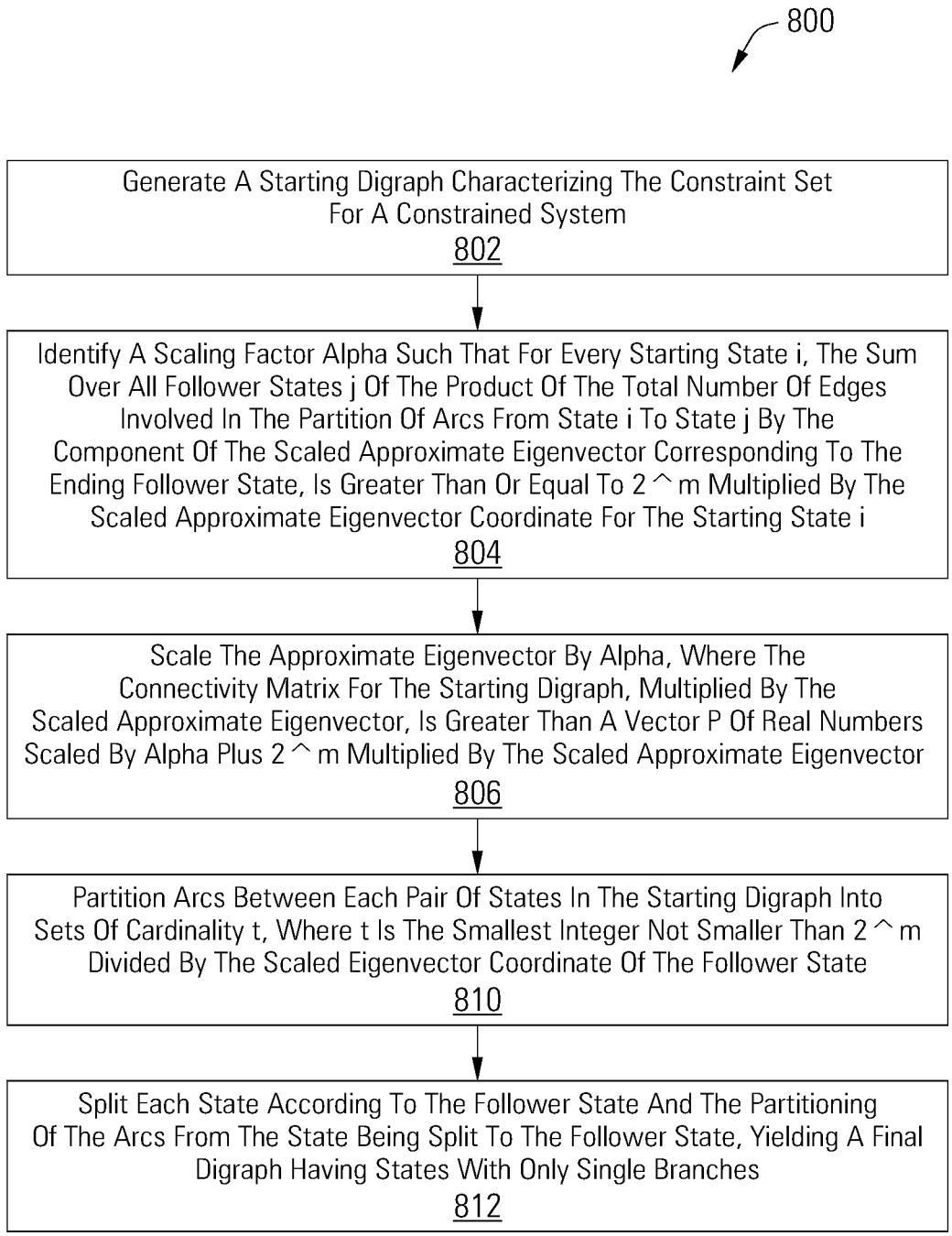
FIG. 8 depicts a flow diagram showing a method for generating a state-split based endec in accordance with various embodiments of the present inventions.

Turning to FIG. 8, a flow diagram 800 depicts a method for generating a state-split based endec in accordance with various embodiments of the present inventions. Following flow diagram 800, a starting digraph is generated characterizing the constraint set for a constrained system (block 802). A scaling factor α is identified such that for every starting state i, the sum over all follower states j of the product of the total number of edges involved in the partition of arcs from state i to state j by the component of the scaled approximate eigenvector corresponding to the ending follower state, is greater than or equal to $2^m$ multiplied by the scaled approximate eigenvector coordinate for the starting state i (block 804). In other words, a scaling factor α is identified such that the inequality of Equation 9 is satisfied, where m is the block length of the encoder. The total number of edges involved in the partition of arcs from state i to state j are calculated in some embodiments as $$N(i,j) * \left\lceil \frac{2^m}{AEs\alpha(j)} \right\rceil.$$

The component of the scaled approximate eigenvector corresponding to the ending follower state j is denoted AEsα(j). The scaled approximate eigenvector coordinate for the starting state i is AESα(i).

The approximate eigenvector is scaled by α, where the connectivity matrix for the starting digraph, multiplied by the scaled approximate eigenvector, is greater than a vector P of real numbers scaled by alpha plus $2^m$ multiplied by the scaled approximate eigenvector (block 806). In other words, after scaling the approximate eigenvector, the inequality of Equation 3 becomes the inequality of Equation 4. The arcs between each pair of states in the starting digraph are partitioned into sets of cardinality t, where t is the smallest integer not smaller than $2^m$ divided by the scaled eigenvector coordinate of the follower state (block 810). (See Equation 7.) Each state is split according to the follower state and the partitioning of the arcs from the state being split to the follower state, yielding a final digraph having states with only single branches (block 812). In various embodiments, hardware or executable instructions may be used to implement an encoder and/or decoder according to the final digraph, with substantially simplified complexity, particularly in the memory structures.

In one embodiment of the method for generating a state-split based endec, a starting digraph DGs has a DNA size of 12×16×67×8 and a PM size of 1×67. The state set $V_{DGs}$ of DGs is {(i,j): 1≤i≤67, 1≤j≤8}. The arc set, $A_{DGs}$, and label map, $L_{DGs}$, are characterized as follows:

There is an arc from state (i1,j1) to state (i2,j2) labeled e iff (if and only if) {for some w, 1≤w≤15, i2 appears in DNA(2, w,i1,j1)} AND {for some v, DNA(3,w,i1,j1)≤v≤DNA(4,w,i1, j1), edge_order(PM(i1),PM(i2),v)=e}.

The approximate eigenvector, AEs, of DGs is defined using the non-negative, integer matrix JB(67×8) as follows: AEs (state(i, j))=2^(35−JB(i, j))—it is a power of 2. It can be said that a state (i, j) is null if JB(i, j)=0. All null states and their outgoing and incoming arcs may be eliminated.

Steps one and two are applied for AEs. For every state (i1, j1), the following inequality holds:

$$\sum_{all\ (i2,\ j2)} \frac{n((i1\ j1),(i2\ j2)) * AEs(i2\ j2)}{2^m} \geq \frac{Ps(i1,\ j1)}{2^m} + AEs(i1\ j1) \quad \text{(Eq 21)}$$

where n((i1 j1),(i2 j2))=DNA(4,k,i1,j1)−DNA(3,k,i1,j1)+ 1, and integer k is such that DNA(2,k,i1,j1)=i2, and where AEs(i1,j1)=2^(35−JB(i1,j1)), and m=34.

For states (i,j), $1 \leq i \leq 67$ and $1 \leq j \leq 8$, Ps(i,j) is set forth in Table 1:

TABLE 1

| i | j = 1 | j = 2 | j = 3 | j = 4 | j = 5 | j = 6 | j = 7 | j = 8 |
|---|---|---|---|---|---|---|---|---|
| 1 | 80.6248 | 32.735 | 24.4309 | 8.5874 | 8.5908 | 17.197 | 8.9559 | 8.7989 |
| 2 | 96.6535 | 9.0099 | 25.0725 | 8.7189 | 16.4992 | 8.6516 | 8.4658 | 8.5908 |
| 3 | 65.4138 | 16.8607 | 32.8346 | 24.7043 | 24.9093 | 8.9941 | 9.27 | 8.9559 |
| 4 | 73.0617 | 32.9979 | 16.9692 | 16.8554 | 16.2594 | 8.459 | 16.8751 | 9.178 |
| 5 | 112.5862 | 16.5461 | 16.7659 | 24.5841 | 8.5662 | 8.4597 | 8.6373 | 8.3719 |
| 6 | 65.5306 | 41.2207 | 8.9955 | 24.9273 | 16.3779 | 16.5867 | 9.111 | 17.1576 |
| 7 | 97.377 | 24.4974 | 16.2404 | 17.0126 | 16.5799 | 8.7756 | 8.9906 | 8.7913 |
| 8 | 113.0294 | 40.9621 | 16.3608 | 8.5025 | 8.3651 | 8.4561 | 8.5358 | 8.4589 |
| 9 | 80.978 | 24.3924 | 32.6333 | 32.4875 | 16.1283 | 8.4831 | 8.4577 | 8.4561 |
| 10 | 96.7133 | 40.9473 | 17.1107 | 24.5027 | 8.4831 | 8.3683 | 8.4577 | 8.5025 |
| 11 | 128.3585 | 17.0668 | 16.3321 | 16.1122 | 8.5152 | 8.5025 | 8.5248 | 8.5017 |
| 12 | 96.8291 | 33.1134 | 24.5477 | 24.1962 | 16.4333 | 24.1275 | 8.2985 | 8.252 |
| 13 | 105.1103 | 40.2811 | 32.121 | 8.4367 | 16.0337 | 8.2875 | 8.3761 | 8.1981 |
| 14 | 104.9082 | 40.4762 | 24.4361 | 16.188 | 8.4114 | 8.3915 | 16.2531 | 8.1693 |
| 15 | 89.2104 | 32.6597 | 24.579 | 16.5318 | 16.5532 | 16.3866 | 16.1857 | 8.3211 |
| 16 | 96.522 | 24.327 | 24.3458 | 40.3301 | 8.3659 | 16.2218 | 8.2444 | 8.1895 |
| 17 | 96.9244 | 24.1617 | 24.3075 | 24.1477 | 16.099 | 8.1694 | 8.2444 | 8.1895 |
| 18 | 128.2904 | 24.2926 | 16.1368 | 8.2042 | 8.1694 | 8.2444 | 8.1895 | 16.2107 |
| 19 | 96.6228 | 24.2629 | 24.4091 | 16.4825 | 16.4087 | 16.1657 | 8.1895 | 8.162 |
| 20 | 120.3181 | 16.5309 | 40.1917 | 16.1538 | 8.0919 | 8.0912 | 8.1554 | 8.1874 |
| 21 | 72.6411 | 32.416 | 32.3044 | 24.1882 | 16.2962 | 8.3563 | 16.1066 | 8.0941 |
| 22 | 96.3644 | 40.417 | 16.1889 | 16.308 | 16.1011 | 16.0547 | 8.0773 | 8.1409 |
| 23 | 128.1842 | 16.2133 | 24.0189 | 8.0941 | 8.0915 | 16.0287 | 8.1727 | 8.1488 |
| 24 | 88.307 | 40.3849 | 16.2933 | 24.1249 | 16.1787 | 16.1493 | 16.0477 | 8.131 |
| 25 | 96.2607 | 24.326 | 32.1952 | 24.0733 | 8.1095 | 8.1471 | 16.1086 | 8.0858 |
| 26 | 104.202 | 24.1448 | 16.1762 | 16.1036 | 16.1395 | 16.0959 | 8.1471 | 16.0289 |
| 27 | 96.0736 | 16.1901 | 16.1772 | 24.1075 | 24.0919 | 16.0541 | 8.1095 | 8.1417 |
| 28 | 112.0089 | 56.056 | 8.0934 | 16.0669 | 8.0373 | 8.057 | 8.0668 | 8.0717 |
| 29 | 72.1177 | 32.2071 | 32.0784 | 16.1092 | 32.0579 | 8.0365 | 8.0291 | 8.0529 |
| 30 | 88.1412 | 48.0081 | 8.1768 | 24.0863 | 16.0524 | 8.0365 | 8.0529 | 8.0373 |
| 31 | 128.045 | 16.0474 | 16.0951 | 16.0805 | 8.0668 | 8.0717 | 8.0623 | 8.042 |
| 32 | 88.1188 | 56.0472 | 16.1286 | 16.0697 | 16.0353 | 16.0336 | 8.0421 | 8.0433 |
| 33 | 96.0833 | 16.0425 | 24.0465 | 16.073 | 32.0199 | 8.0399 | 8.0399 | 8.0421 |
| 34 | 120.0941 | 24.0942 | 24.0455 | 8.0399 | 8.0421 | 8.0421 | 8.0191 | 8.0214 |
| 35 | 96.0481 | 16.0667 | 24.0447 | 16.0824 | 16.0844 | 16.0442 | 16.0529 | 8.0399 |
| 36 | 80.0511 | 24.0653 | 24.06 | 16.0809 | 16.0449 | 24.0838 | 32.0209 | 8.0164 |
| 37 | 80.1407 | 40.0421 | 24.0516 | 24.0256 | 16.0161 | 8.0249 | 8.0164 | 8.0216 |
| 38 | 96.0676 | 24.0181 | 24.0736 | 24.0285 | 16.0181 | 8.0231 | 8.0249 | 8.0164 |
| 39 | 72.0272 | 32.0619 | 56.0433 | 16.0286 | 8.0216 | 8.0148 | 8.0105 | 8.0186 |
| 40 | 96.0462 | 24.0436 | 24.0394 | 24.0184 | 16.0139 | 16.0111 | 16.0061 | 8.0022 |
| 41 | 80.099 | 32.0476 | 16.0348 | 32.016 | 8.0252 | 24.0172 | 16.0049 | 8.0042 |
| 42 | 80.0928 | 40.0388 | 24.0234 | 16.0281 | 16.0096 | 24.0067 | 8.0022 | 8.0031 |
| 43 | 120.0342 | 32.0149 | 16.0105 | 16.0057 | 8.0022 | 8.006 | 8.0053 | 8.0044 |
| 44 | 96.0494 | 32.0094 | 16.0071 | 16.0111 | 24.0084 | 16.01 | 16.0038 | 8.0038 |
| 45 | 112.0208 | 24.0083 | 16.0076 | 16.0085 | 16.0043 | 16.0033 | 8.0028 | 8.0041 |
| 46 | 80.0468 | 32.0082 | 24.0068 | 24.0156 | 24.0033 | 16.0055 | 8.0047 | 8.005 |
| 47 | 104.0222 | 16.0192 | 32.0101 | 16.0054 | 16.0019 | 16.0044 | 8.0028 | 8.0041 |
| 48 | 88.0379 | 56.0081 | 16.0059 | 16.0022 | 8.0013 | 8.0006 | 8.0016 | 8.0021 |
| 49 | 104.0032 | 16.0049 | 24.003 | 16.0017 | 16.0009 | 16.0002 | 8.001 | 16.0005 |
| 50 | 72.0275 | 40.0106 | 16.0053 | 16.005 | 24.0034 | 24.0015 | 8.001 | 16.001 |
| 51 | 104.0024 | 16.0075 | 16.0018 | 24.0018 | 16.0005 | 16.0006 | 8.001 | 16.0006 |
| 52 | 88.0125 | 24.0027 | 24.0032 | 24.001 | 16.0009 | 16.0005 | 8.0001 | 8.0001 |
| 53 | 72.0157 | 16.0072 | 40.0012 | 16.0005 | 24.0003 | 8.0002 | 24.0004 | 16.0001 |
| 54 | 72.0093 | 24.004 | 24.0024 | 8.0027 | 16.0012 | 16.0008 | 16.0008 | 16.0003 |
| 55 | 72.0183 | 16.0091 | 24.0036 | 16.0023 | 16.0008 | 24.0003 | 32.0001 | 24.0001 |
| 56 | 104.0011 | 24.0003 | 16.0002 | 16.0002 | 24.0001 | 8.0001 | 8.0001 | 8.0001 |
| 57 | 80.0018 | 40.0002 | 32.0001 | 16 | 16 | 8 | 8 | 8 |
| 58 | 104.0006 | 16.0003 | 24.0002 | 16.0002 | 8.0001 | 16 | 16 | 8 |
| 59 | 80.0009 | 32.0002 | 24.0003 | 32 | 16 | 8 | 8 | 8 |
| 60 | 64.0008 | 32.0007 | 16.0004 | 32.0001 | 8.0001 | 24.0001 | 16 | 8 |
| 61 | 120.0001 | 16 | 16 | 16 | 8 | 8 | 8 | 8 |
| 62 | 88.0002 | 24.0003 | 32 | 16 | 16 | 8 | 8 | x |
| 63 | 104.0003 | 24.0001 | 16.0001 | 16.0001 | 8 | 16 | 8 | 8 |
| 64 | 96 | 32 | 8 | 8 | 8 | 8 | 8 | 8 |
| 65 | 128.0001 | 24 | 16 | 8 | 8 | x | x | x |
| 66 | 128.0001 | 16 | 16 | 8 | 16 | 8 | 8 | 8 |
| 67 | 128.0001 | 16 | 16 | 16 | 8 | 8 | 8 | 8 |

For states (i,j), 1≤i≤67 and 1≤j≤8, the ratio of Ps(i,j)/2m to the cardinality of follower set of state (i,j) is set forth in Table 2:

TABLE 2

| i | j = 1 | j = 2 | j = 3 | j = 4 | j = 5 | j = 6 | j = 7 | j = 8 |
|---|---|---|---|---|---|---|---|---|
| 1 | 1.0078 | 1.023 | 1.018 | 1.0734 | 1.0739 | 1.0748 | 1.1195 | 1.0999 |
| 2 | 1.0068 | 1.1262 | 1.0447 | 1.0899 | 1.0312 | 1.0815 | 1.0582 | 1.0739 |
| 3 | 1.0221 | 1.0538 | 1.0261 | 1.0293 | 1.0379 | 1.1243 | 1.1588 | 1.1195 |
| 4 | 1.0147 | 1.0312 | 1.0606 | 1.0535 | 1.0162 | 1.0574 | 1.0547 | 1.1473 |
| 5 | 1.0052 | 1.0341 | 1.0479 | 1.0243 | 1.0708 | 1.0575 | 1.0797 | 1.0465 |
| 6 | 1.0239 | 1.0305 | 1.1244 | 1.0386 | 1.0236 | 1.0367 | 1.1389 | 1.0723 |
| 7 | 1.0143 | 1.0207 | 1.015 | 1.0633 | 1.0362 | 1.0969 | 1.1238 | 1.0989 |
| 8 | 1.0092 | 1.0241 | 1.0226 | 1.0628 | 1.0456 | 1.057 | 1.067 | 1.0574 |
| 9 | 1.0122 | 1.0163 | 1.0198 | 1.0152 | 1.008 | 1.0604 | 1.0572 | 1.057 |
| 10 | 1.0074 | 1.0237 | 1.0694 | 1.0209 | 1.0604 | 1.046 | 1.0572 | 1.0628 |
| 11 | 1.0028 | 1.0667 | 1.0208 | 1.007 | 1.0644 | 1.0628 | 1.0656 | 1.0627 |
| 12 | 1.0086 | 1.0348 | 1.0228 | 1.0082 | 1.0271 | 1.0053 | 1.0373 | 1.0315 |
| 13 | 1.0107 | 1.007 | 1.0038 | 1.0546 | 1.0021 | 1.0359 | 1.047 | 1.0248 |
| 14 | 1.0087 | 1.0119 | 1.0182 | 1.0117 | 1.0514 | 1.0489 | 1.0158 | 1.0212 |
| 15 | 1.0138 | 1.0206 | 1.0241 | 1.0332 | 1.0346 | 1.0242 | 1.0116 | 1.0401 |
| 16 | 1.0054 | 1.0136 | 1.0144 | 1.0083 | 1.0457 | 1.0139 | 1.0305 | 1.0237 |
| 17 | 1.0096 | 1.0067 | 1.0128 | 1.0062 | 1.0062 | 1.0212 | 1.0305 | 1.0237 |
| 18 | 1.0023 | 1.0122 | 1.0086 | 1.0255 | 1.0212 | 1.0305 | 1.0237 | 1.0132 |
| 19 | 1.0065 | 1.011 | 1.017 | 1.0302 | 1.0255 | 1.0104 | 1.0237 | 1.0202 |
| 20 | 1.0027 | 1.0332 | 1.0048 | 1.0096 | 1.0115 | 1.0114 | 1.0194 | 1.0234 |
| 21 | 1.0089 | 1.013 | 1.0095 | 1.0078 | 1.0185 | 1.0445 | 1.0067 | 1.0118 |
| 22 | 1.0038 | 1.0104 | 1.0118 | 1.0192 | 1.0063 | 1.0034 | 1.0097 | 1.0176 |
| 23 | 1.0014 | 1.0133 | 1.0008 | 1.0118 | 1.0114 | 1.0018 | 1.0216 | 1.0186 |
| 24 | 1.0035 | 1.0096 | 1.0183 | 1.0052 | 1.0112 | 1.0093 | 1.003 | 1.0164 |
| 25 | 1.0027 | 1.0136 | 1.0061 | 1.0031 | 1.0137 | 1.0184 | 1.0068 | 1.0107 |
| 26 | 1.0019 | 1.006 | 1.011 | 1.0065 | 1.0087 | 1.006 | 1.0184 | 1.0018 |
| 27 | 1.0008 | 1.0119 | 1.0111 | 1.0045 | 1.0038 | 1.0034 | 1.0137 | 1.0177 |
| 28 | 1.0001 | 1.001 | 1.0117 | 1.0042 | 1.0047 | 1.0071 | 1.0084 | 1.009 |
| 29 | 1.0016 | 1.0065 | 1.0024 | 1.0068 | 1.0018 | 1.0046 | 1.0036 | 1.0066 |
| 30 | 1.0016 | 1.0002 | 1.0221 | 1.0036 | 1.0033 | 1.0046 | 1.0066 | 1.0047 |
| 31 | 1.0004 | 1.003 | 1.0059 | 1.005 | 1.0084 | 1.009 | 1.0078 | 1.0053 |
| 32 | 1.0014 | 1.0008 | 1.008 | 1.0044 | 1.0022 | 1.0021 | 1.0053 | 1.0054 |
| 33 | 1.0009 | 1.0027 | 1.0019 | 1.0046 | 1.0006 | 1.005 | 1.005 | 1.0053 |
| 34 | 1.0008 | 1.0039 | 1.0019 | 1.005 | 1.0053 | 1.0053 | 1.0024 | 1.0027 |
| 35 | 1.0005 | 1.0042 | 1.0019 | 1.0052 | 1.0053 | 1.0028 | 1.0033 | 1.005 |
| 36 | 1.0006 | 1.0027 | 1.0025 | 1.0051 | 1.0028 | 1.0035 | 1.0007 | 1.0021 |
| 37 | 1.0018 | 1.0011 | 1.0022 | 1.0011 | 1.001 | 1.0031 | 1.0021 | 1.0027 |
| 38 | 1.0007 | 1.0008 | 1.0031 | 1.0012 | 1.0011 | 1.0029 | 1.0031 | 1.0021 |
| 39 | 1.0004 | 1.0019 | 1.0008 | 1.0018 | 1.0027 | 1.0018 | 1.0013 | 1.0023 |
| 40 | 1.0005 | 1.0018 | 1.0016 | 1.0008 | 1.0009 | 1.0007 | 1.0004 | 1.0003 |
| 41 | 1.0012 | 1.0015 | 1.0022 | 1.0005 | 1.0032 | 1.0007 | 1.0003 | 1.0005 |
| 42 | 1.0012 | 1.001 | 1.001 | 1.0018 | 1.0006 | 1.0003 | 1.0003 | 1.0004 |
| 43 | 1.0003 | 1.0005 | 1.0007 | 1.0004 | 1.0003 | 1.0007 | 1.0007 | 1.0006 |
| 44 | 1.0005 | 1.0003 | 1.0004 | 1.0007 | 1.0003 | 1.0006 | 1.0002 | 1.0005 |
| 45 | 1.0002 | 1.0003 | 1.0005 | 1.0005 | 1.0003 | 1.0002 | 1.0004 | 1.0005 |
| 46 | 1.0006 | 1.0003 | 1.0003 | 1.0007 | 1.0001 | 1.0003 | 1.0006 | 1.0006 |
| 47 | 1.0002 | 1.0012 | 1.0003 | 1.0003 | 1.0001 | 1.0003 | 1.0004 | 1.0005 |
| 48 | 1.0004 | 1.0001 | 1.0004 | 1.0001 | 1.0002 | 1.0001 | 1.0002 | 1.0003 |
| 49 | 1 | 1.0003 | 1.0001 | 1.0001 | 1.0001 | 1 | 1.0001 | 1 |
| 50 | 1.0004 | 1.0003 | 1.0003 | 1.0003 | 1.0001 | 1.0001 | 1.0001 | 1.0001 |
| 51 | 1 | 1.0005 | 1.0001 | 1.0001 | 1 | 1 | 1.0001 | 1 |
| 52 | 1.0001 | 1.0001 | 1.0001 | 1 | 1.0001 | 1 | 1 | 1 |
| 53 | 1.0002 | 1.0005 | 1 | 1 | 1 | 1 | 1 | 1 |
| 54 | 1.0001 | 1.0002 | 1.0001 | 1.0003 | 1.0001 | 1 | 1.0001 | 1 |
| 55 | 1.0003 | 1.0006 | 1.0002 | 1.0001 | 1 | 1 | 1 | 1 |
| 56 | 1 | 1 | 1 | 1 | 1 | 1 | 1 | 1 |
| 57 | 1 | 1 | 1 | 1 | 1 | 1 | 1 | 1 |
| 58 | 1 | 1 | 1 | 1 | 1 | 1 | 1 | 1 |
| 59 | 1 | 1 | 1 | 1 | 1 | 1 | 1 | 1 |
| 60 | 1 | 1 | 1 | 1 | 1 | 1 | 1 | 1 |
| 61 | 1 | 1 | 1 | 1 | 1 | 1 | 1 | 1 |
| 62 | 1 | 1 | 1 | 1 | 1 | 1 | 1 | x |
| 63 | 1 | 1 | 1 | 1 | 1 | 1 | 1 | 1 |
| 64 | 1 | 1 | 1 | 1 | 1 | 1 | 1 | 1 |
| 65 | 1 | 1 | 1 | 1 | 1 | x | x | x |
| 66 | 1 | 1 | 1 | 1 | 1 | 1 | 1 | 1 |
| 67 | 1 | 1 | 1 | 1 | 1 | 1 | 1 | 1 |

Therefore, (Ps(i,j)/2m)/(cardinality of follower set of state (i,j)) is greater than and equal to 1. Hence the inequality of Equation 17 and subsequently of Equation 7 hold. Notably, the reason $\alpha=1$ works for this embodiment is that AEs was scaled by 8 for this purpose. Initially Equation 17 was not satisfied until $\alpha$ was set to 8 to cause the inequality of Equation 17 to hold.

The digraph DGs is then split with $\alpha=1$. For every state (i1,j1) in DGs and every follower state (i2,j2) of (i1,j1), the following statements can be made:

1. There are n((i1 j1),(i2 j2)) arcs from state (i1,j1) to state (i2,j2),
2. n((i1 j1), (i2 j2))=DNA(4,k,i1,j1)−DNA(3,k,i1,j1)+1, integer k is such that DNA(2,k,i1,j1)=i2.
3. The approximate eigenvector coordinate corresponding to state (i1,j1) is $2^{35-JB(i1,j1)}$. (AEs(i1, j1)=$2^{35-JB(i1,j1)}$)
4. t((i1 j1),(i2 j2))=ceiling(2m/AEs(i2,j2))=ceiling($2^m/2^{35-JB(i2,j2)}$)=$2^{(m-35+JB(i2,j2))}$. See Equation 5 for t.
5. N((i1 j1),(i2 j2))=floor(n((i1 j1),(i2 j2))/t) =floor(n((i1 j1),(i2 j2))/$2^{(m-35+JB(i2,j2))}$)
6. There are N((i1 j1),(i1 j2)) sets in the partitioning of arcs from (i1,j1) to (i2,j2): A((i1 j1),(i2 j2))={$A_1$((i1 j1),(i2 j2)), $A_2$((i1 j1),(i2 j2)), . . . , $A_{N(i1\ j1),(i2\ j2)}$((i1 j1),(i2 j2))}.
7. Each set, $A_k$((i1 j1),(i2 j2)), has t((i1 j1),(i2 j2)) arcs.

For each set, Ak((i1 j1),(i2 j2)), one state is split off from state (i1,j1), with the new state named ((i1,j1),(i2,j2),k). Arcs in Ak((i1 j1),(i2 j2)) are given to state ((i1,j1),(i2,j2),k), and these arcs are removed from state (i1,j1). To complete the splitting, the original input to (i1,j1) is duplicated for states ((i1,j1),(i2,j2),k).

Figure 9:
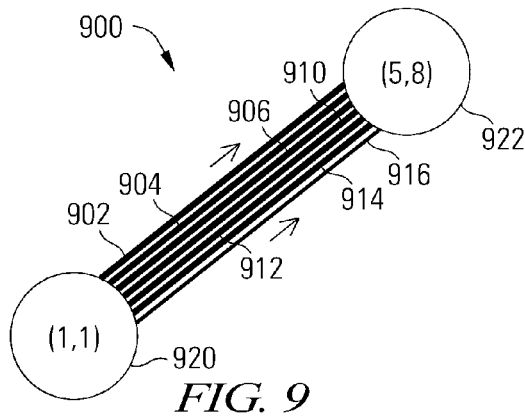
FIG. 9 depicts a state and follower state with connecting arcs before state splitting in accordance with various embodiments of the present inventions.
Figure 10:
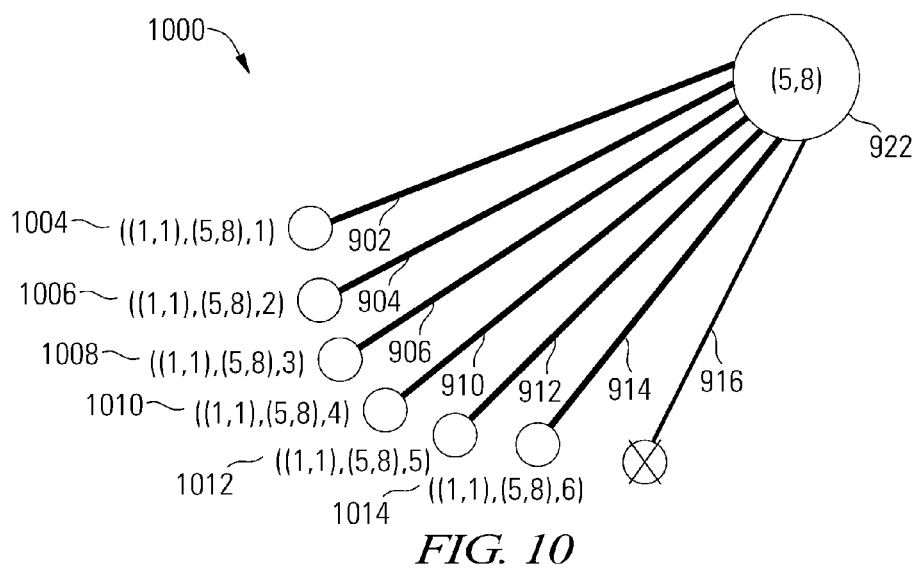
FIG. 10 depicts new states with connecting arcs to the follower state after state splitting in accordance with various embodiments of the present inventions.

This splitting is depicted in FIGS. 9 and 10 for (i1,j1)=(1,1) and (i2,j2)=(5,8). There are 915533334 arcs from state (1,1) to state (5,8); n((1,1),(5,8))=915533334; DNA(2,5,1,1)=5, and DNA(4,5,1,1)−DNA(3,5,1,1)+1=915533334. AEs$\alpha$(5,8)=$2^7$ ($\alpha=1$). Therefore, t=$2^{34}/2^7$=$2^{27}$. N((1,1),(5,8))=floor(n((1,1),(5,8))/t)=floor(915533334/227)=floor(6.8213)=6. Therefore the partitioning of the arcs from (1,1) to (5,8) gives: A((1,1),(5,8))={A1((1,1),(5,6)), A2((1,1),(5,6)), . . . , A6((1,1),(5,6))}.

Turning to FIG. 9, there are multiple sets 902, 904, 906, 910, 912, 914 and 916 of arcs between state (1,1) 920 and state (5,8) 922. Initially, arcs in sets 902, 904, 906, 910, 912, 914 and 916 are not partitioned and form a single group, but may be partitioned as shown in FIG. 9, with the number of arcs in set 916 being insufficient to form a partition set.

Turning to FIG. 10, state (1,1) 920 is split according to the partitioning, yielding six new states ((1,1),(5,8),1-6) 1004, 1006, 1008, 1010, 1012 and 1014. Each new state receives, as its output, arcs from one of the full partition sets 902, 904, 906, 910, 912, 914. Edges in set 916 are neglected. A portion (not shown) of state (1,1) 920 with edges going to states other than (5,8) also remains. As shown in FIG. 10, state ((1,1),(5,8),k), 1≤k≤6, has outgoing arcs leading to state (5,8) 922 (in DGs) and therefore leading to states ((5,8),(u1,v1),w) that are split from state (5,8) 922 (in DGf). Thus states of DGf have single branches.

Notably, the inequality of Equation 17 is only a sufficient condition for Equation 7, and often a smaller value of $\alpha$ will work. In practice, one can gradually increase $\alpha$ from 1 to determine when Equation 7 becomes true. In some embodiments, the lowest value of $\alpha$ that makes Equation 7 is used so that AEs is scaled only as much as needed for Equation 7. One reason that AEs is scaled up is that throwing away arcs (e.g., 916) lowers the entropy of the digraph. This might lower entropy below the code rate, making it impossible to construct the code. Scaling AEs lightens losses due to elimination of the arcs. We thus see that in some cases, a larger starting approximate eigenvector is beneficial when it permits a representation that has sparse branching, and care can be taken to scale moderately in order not to increase latency.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the present invention provides novel apparatuses and methods for encoding and decoding data for constrained systems with reduced hardware complexity using state-split based endecs. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A method of generating an encoder comprising:
   generating a first directed graph characterizing a constraint set for a constrained system;
   identifying a scaling factor for an approximate eigenvector for the first directed graph;
   applying the scaling factor to the approximate eigenvector for the first directed graph to yield a scaled approximate eigenvector;
   partitioning arcs between each pair of states in the first directed graph;
   performing a state splitting operation on the first directed graph according to the partitioning of the arcs to yield a second directed graph; and
   generating the encoder based on the second directed graph, wherein the encoder comprises a hardware encoder.

2. The method of claim 1, wherein the second directed graph contains only single branches in each state.

3. The method of claim 1, wherein identifying the scaling factor comprises identifying the scaling factor such that for every starting state in the first directed graph, a sum over all follower states of a product of a total number of edges involved in a partition of arcs from the starting state to a follower state by a component of the scaled approximate eigenvector corresponding to the follower state, is greater than or equal to two raised to a power of a block length of the encoder, multiplied by the scaled approximate eigenvector coordinate for the starting state.

4. The method of claim 3, wherein identifying the scaling factor further comprises beginning with an integer scaling factor of one and incrementing the scaling factor by ones until the greater than or equal to condition is satisfied.

5. The method of claim 1, wherein a connectivity matrix for the first directed graph, multiplied by the scaled approximate eigenvector, is greater than a vector of real numbers scaled by the scaling factor plus two raised to a power of a block length of the encoder multiplied by the scaled approximate eigenvector.

6. The method of claim 1, wherein partitioning the arcs comprises partitioning the arcs into sets of a cardinality of a smallest integer not smaller than two raised to a power of a block length of the encoder divided by a scaled eigenvector coordinate of a follower state.

7. The method of claim 1, wherein the method is at least in part performed by a processor executing instructions.

8. The method of claim 1, wherein the method is at least in part performed by an integrated circuit.

9. The method of claim 1, further comprising including the encoder in a storage system to encode data prior to storage in the storage system.

10. The method of claim 1, further comprising generating a hardware decoder based on the second directed graph.

11. The method of claim 10, further comprising incorporating the hardware encoder and the hardware decoder in a storage system with a storage medium between the hardware encoder and the hardware decoder.

12. The method of claim 1, wherein the encoder is designed in a single state-splitting operation.

13. The method of claim 12, wherein an approximate eigenvector for the first directed graph is scaled before the single state-splitting operation.

14. The method of claim 12, wherein the single state-splitting operation comprises partitioning arcs between starting states and follower states in the first directed graph into sets of a cardinality of a smallest integer not smaller than two raised to a power of a block length of the encoder divided by a scaled eigenvector coordinate of the follower state.

15. A system for generating an encoder comprising:
 a tangible computer readable medium, the computer readable medium including instructions executable by a processor to:
 generate a first directed graph characterizing a constraint set for a constrained system;
 identify a scaling factor for an approximate eigenvector for the first directed graph;
 apply the scaling factor to the approximate eigenvector for the first directed graph to yield a scaled approximate eigenvector;
 partition arcs between each pair of states in the first directed graph;
 perform a state splitting operation on the first directed graph according to the partitioning of the arcs to yield a second directed graph; and
 generate the encoder based on the second directed graph.

16. The system of claim 15, wherein the second directed graph contains only single branches in each state.

17. The system of claim 15, wherein the instructions to identify the scaling factor comprise instructions to identify the scaling factor such that for every starting state in the first directed graph, a sum over all follower states of a product of a total number of edges involved in a partition of arcs from the starting state to a follower state by a component of the scaled approximate eigenvector corresponding to the follower state, is greater than or equal to two raised to a power of a block length of the encoder, multiplied by the scaled approximate eigenvector coordinate for the starting state.

18. The system of claim 15, wherein the instructions to identify the scaling factor comprise instructions to begin with an integer scaling factor of one and to increment the scaling factor by ones until the greater than or equal to condition is satisfied.

19. The system of claim 15, wherein a connectivity matrix for the first directed graph, multiplied by the scaled approximate eigenvector, is greater than a vector of real numbers scaled by the scaling factor plus two raised to a power of a block length of the encoder multiplied by the scaled approximate eigenvector.

20. The system of claim 15, wherein the instructions to partition the arcs comprise instructions to partition the arcs into sets of a cardinality of a smallest integer not smaller than two raised to a power of a block length of the encoder divided by a scaled eigenvector coordinate of a follower state.

* * * * *